United States Patent
Badr et al.

(10) Patent No.: US 11,175,592 B2
(45) Date of Patent: Nov. 16, 2021

(54) METHODS AND APPARATUS FOR INSPECTION OF A STRUCTURE AND ASSOCIATED APPARATUSES

(71) Applicant: ASML Netherlands B. V., Veldhoven (NL)

(72) Inventors: Elie Badr, Veldhoven (NL); Shawn Shakahwat Millat, Eindhoven (NL); Giacomo Miceli, Eindhoven (NL); Alok Verma, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 69 days.

(21) Appl. No.: 16/656,094

(22) Filed: Oct. 17, 2019

(65) Prior Publication Data

US 2020/0124983 A1 Apr. 23, 2020

(30) Foreign Application Priority Data

Oct. 18, 2018 (EP) ..................................... 18201147

(51) Int. Cl.
*G03F 7/20* (2006.01)

(52) U.S. Cl.
CPC ...... *G03F 7/70633* (2013.01); *G03F 7/70625* (2013.01); *G03F 7/70433* (2013.01)

(58) Field of Classification Search
CPC ............. G03F 7/70633; G03F 7/70625; G03F 7/70616; G03F 7/70683

(Continued)

(56) References Cited

U.S. PATENT DOCUMENTS 9,310,690 B2    4/2016 Deguenther et al.
9,958,791 B2 *  5/2018 Mathijssen ............. G03F 7/213
(Continued)

FOREIGN PATENT DOCUMENTS

EP    1 628 164 A2   2/2006
TW    I635368 B      9/2018
(Continued)

OTHER PUBLICATIONS

International Search Report and Written Opinion of the International Searching Authority directed to related International Patent Application No. PCT/EP2019/075819, dated Dec. 19, 2019; 12 pages.

*Primary Examiner* — Hung Nguyen
(74) *Attorney, Agent, or Firm* — Sterne, Kessler, Goldstein & Fox P.L.L.C.

(57) ABSTRACT

A method for determining an overlay metric is disclosed including obtaining angle resolved distribution spectrum data relating to a measurement of a target structure including a symmetrical component. An overlay dependent contour of a feature of the target structure is determined from the angle resolved distribution spectrum data, from which an overlay metric is determined. The method includes exposing an exposed feature onto a masked layer including a mask which defines masked and unmasked areas of the layer, such that a first portion of the exposed feature is exposed on a masked area of the layer and a second portion of the exposed feature is exposed on a non-masked area of the layer, the size of the first portion with respect to the second portion being overlay dependent; and performing an etch step to define an etched feature, the etched feature corresponding to the second portion of the exposed feature.

17 Claims, 8 Drawing Sheets

(58) Field of Classification Search
USPC .............. 403/5, 30; 355/52, 55; 356/237.2
See application file for complete search history.

(56) References Cited

U.S. PATENT DOCUMENTS

| | | | |
|---|---|---|---|
| 2004/0038455 A1* | 2/2004 | Seligson | G03F 7/70633 |
| | | | 438/122 |
| 2006/0066855 A1 | 3/2006 | Boef et al. | |
| 2016/0117847 A1* | 4/2016 | Pandev | G01N 21/956 |
| | | | 348/87 |
| 2017/0097575 A1 | 4/2017 | Pandey et al. | |
| 2017/0269480 A1 | 9/2017 | Finders | |
| 2018/0239263 A1 | 8/2018 | Mathijssen et al. | |
| 2018/0292761 A1 | 10/2018 | Cekli et al. | |
| 2019/0033727 A1* | 1/2019 | Noot | G03F 7/70616 |

FOREIGN PATENT DOCUMENTS

| | | |
|---|---|---|
| TW | I636334 B | 9/2018 |
| TW | I638238 B | 10/2018 |
| WO | WO 2017/148981 A1 | 9/2017 |
| WO | WO 2017/148982 A1 | 9/2017 |
| WO | WO 2017/149009 A1 | 9/2017 |

* cited by examiner

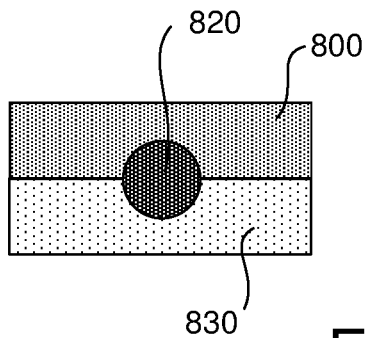
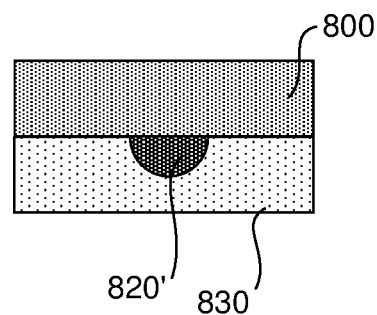
Fig. 9(a)
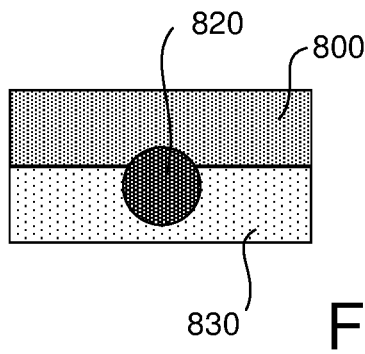
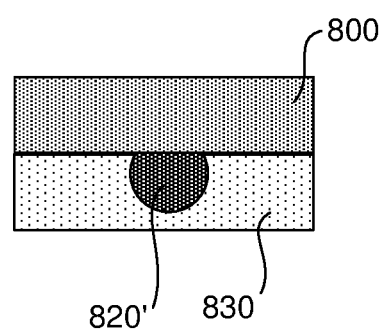
Fig. 9(b)
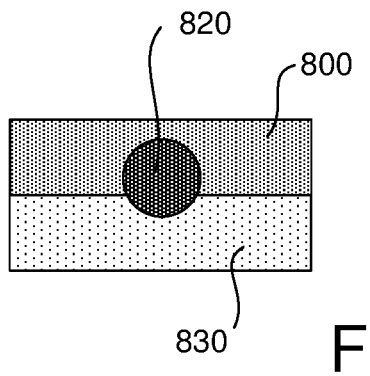
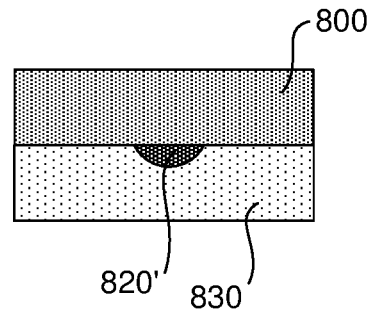
Fig. 9(c)
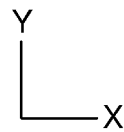

METHODS AND APPARATUS FOR INSPECTION OF A STRUCTURE AND ASSOCIATED APPARATUSES

FIELD

The present invention relates to metrology of microscopic structures, for example to assess overlay performance of a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, it is necessary to measure parameters of the patterned substrate, for example the overlay error between successive layers formed in or on it. There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Due to the size of the structures being measured, such scatterometers cannot directly measure dimensions (e.g., overlay, critical dimension (CD) or edge placement error (EPE)) of the structures. Instead, such dimensional measurements are typically made using reconstruction techniques. Such reconstruction techniques belong to a group of problems known under the general name of inverse scattering, in which observed data is matched to a possible physical situation. The aim is to find a physical situation that gives rise to the observed data as closely as possible. In the case of scatterometry, the electromagnetic theory (Maxwell's equations) allows one to predict what will be the measured (scattered) data for a given physical situation. This is called the forward scattering problem. The inverse scattering problem is now to find the proper physical situation that corresponds to the actual measured data, which is typically a highly nonlinear problem. To solve this inverse scattering problem, a nonlinear solver is used that uses the solutions of many forward scattering problems. In known approaches for reconstruction, the nonlinear problem is founded on three ingredients:

minimization of the difference between measured data and data computed from the estimated scattering setup, e.g., by the Gauss-Newton method or a similar numerical algorithm;

parameterized shapes in the scattering setup, e.g. radius and height of a contact hole;

sufficiently high accuracy in the solution of the forward problem (e.g. computed reflection coefficients) each time the parameters are updated.

SUMMARY

According to a first aspect of the present invention, there is provided a method for determining an overlay metric from a target structure, said method comprising: obtaining angle resolved distribution spectrum data relating to a measurement of the target structure, said angle resolved distribution spectrum data comprising a symmetrical component; determining an overlay dependent contour of a feature of said target structure from said angle resolved distribution spectrum data; and determining said overlay metric from said contour.

According to a second aspect of the present invention, there is provided a method of forming a target structure on a substrate, comprising: exposing an exposed feature onto a masked layer comprising a mask which defines masked and unmasked areas of the layer, such that a first portion of the exposed feature is exposed on a masked area of said layer and a second portion of the exposed feature is exposed on a non-masked area of said layer, the size of the first portion with respect to the second portion being overlay dependent; and performing an etch step to define an etched feature, said etched feature corresponding to said second portion of the exposed feature.

According to a third aspect of the present invention, there is provided an inspection apparatus comprising: projection optics for projecting measurement radiation onto a structure on a substrate; a detection arrangement operable to obtain a measured response resultant from scattering of said measurement radiation by said structure; and a processor; said inspection apparatus being operable to perform the method of the first aspect.

According to a fourth aspect of the present invention, there is provided a manufacturing apparatus comprising a lithographic exposure apparatus, the lithographic exposure apparatus comprising: an illumination source for providing exposure illumination; a reticle stage for holding a patterning device which patterns said exposure illumination; and a substrate stage for holding the substrate; said lithographic exposure apparatus being operable to perform the exposure step of the second aspect.

According to a fifth aspect of the present invention, there is provided a computer program product containing one or more sequences of machine-readable instructions, the instructions being adapted to cause one or more processors to perform a method according to the first aspect.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIGS. 7(a)-7(b) schematically depict 7(a) a first step of a self-aligned BEOL process to expose vias and 7(b) a second step of a self-aligned BEOL process to etch the vias.

Figure 8A:
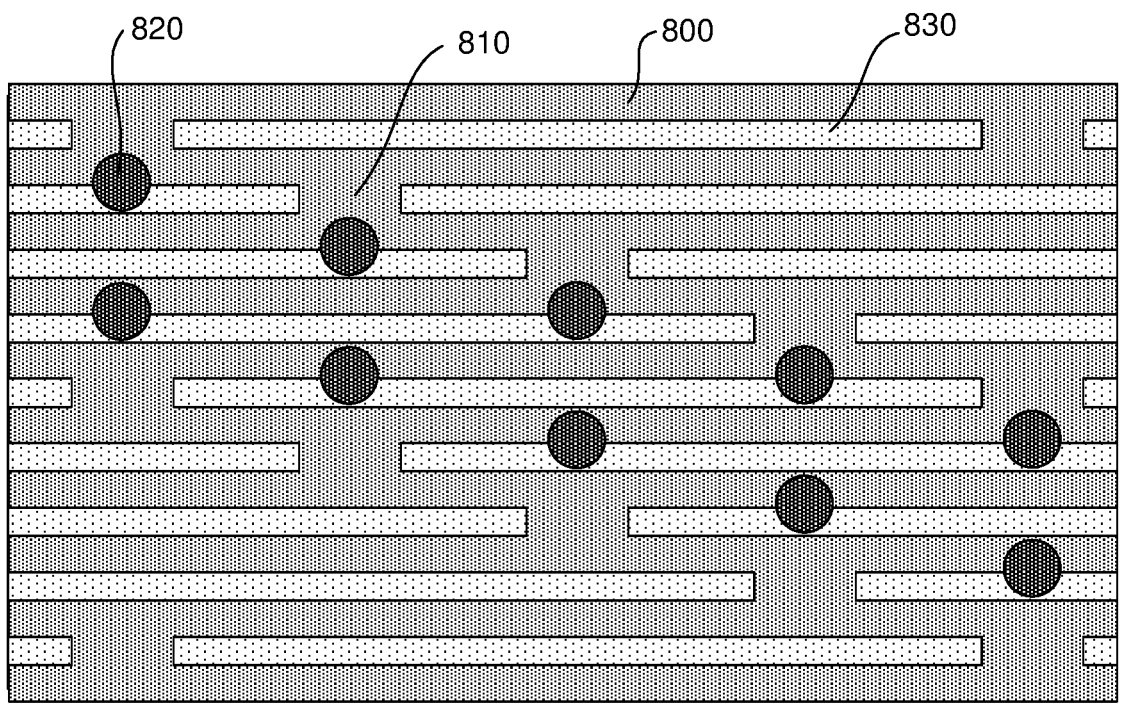
Figure 8B:
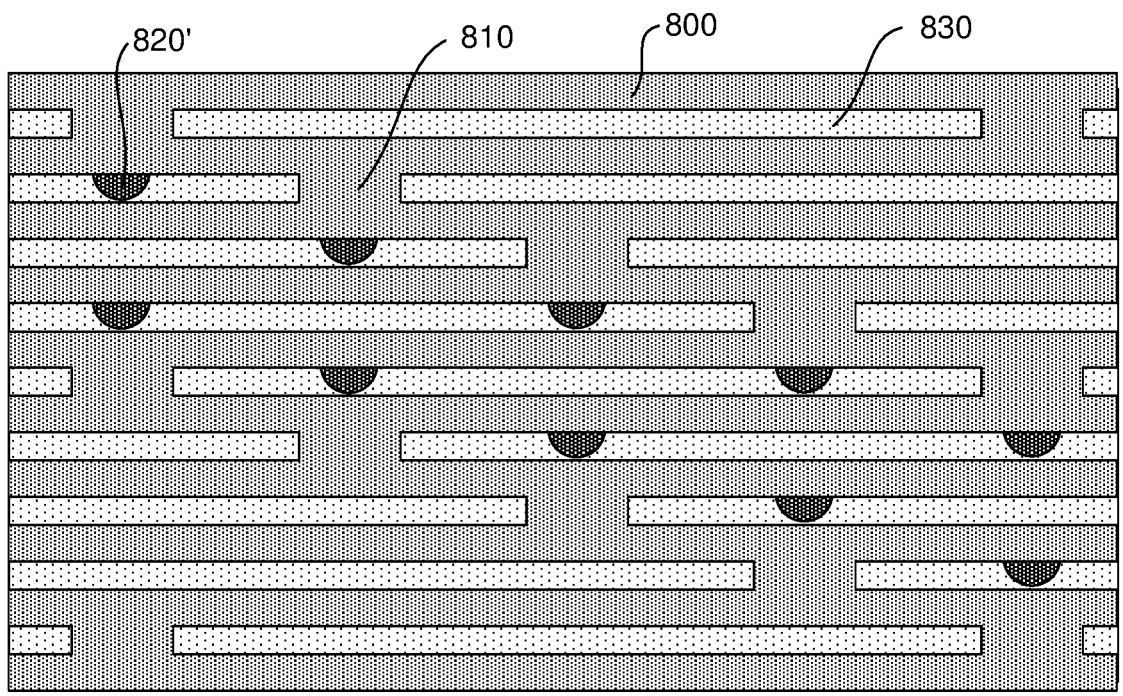

FIGS. 8(a)-8(b) schematically depict 8(a) a first step of a self-aligned BEOL process to expose vias to form a target according to a first embodiment of the invention and 8(b) a second step of a self-aligned BEOL process to etch the vias to form a target according to the first embodiment of the invention;

FIGS. 9(a) to 9(c) each schematically depict a detail of the target formed by the steps depicted in FIG. 8, for three different overlay values.

Figure 10A:
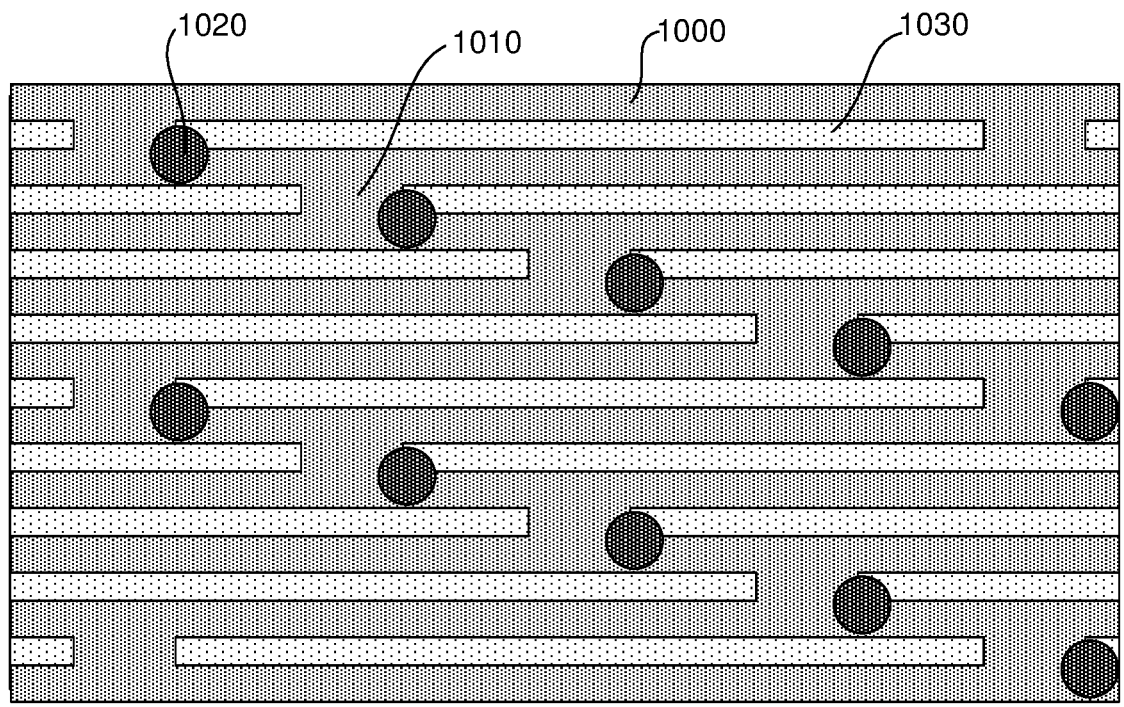
Figure 10B:
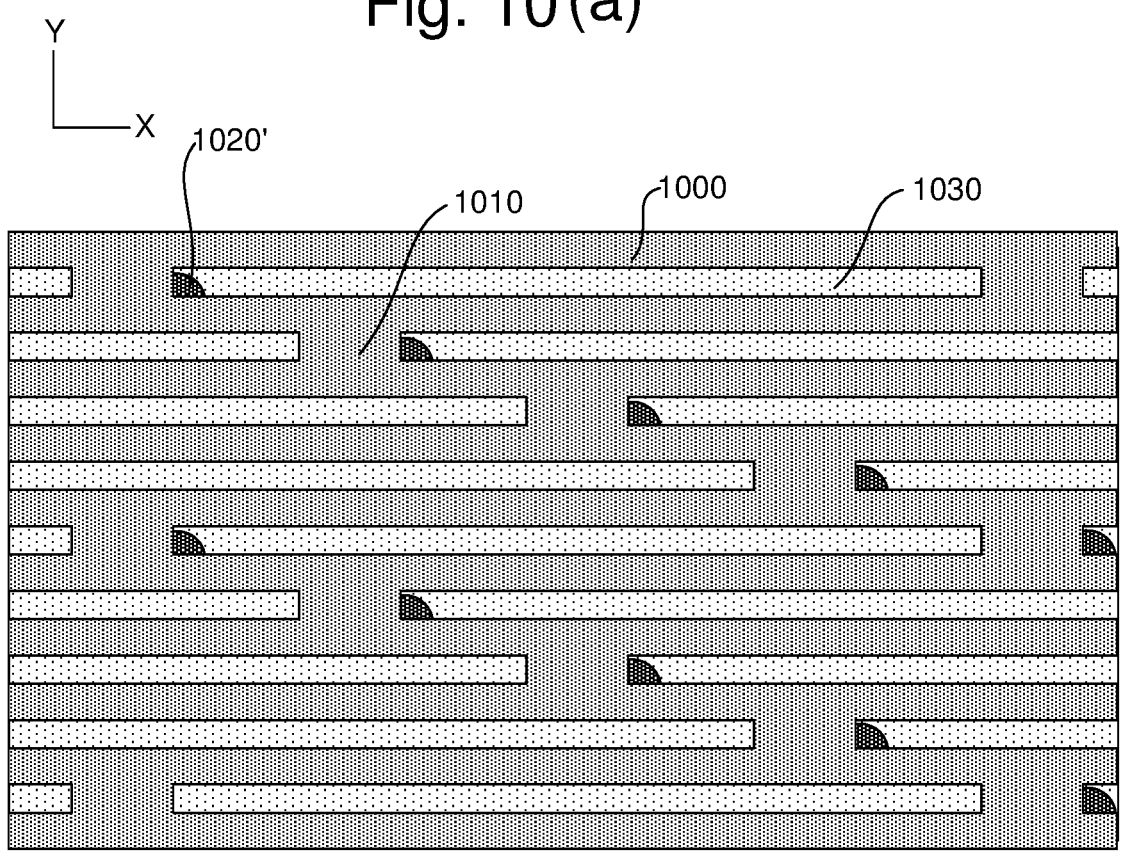

FIGS. 10(a)-10(b) schematically depict 10(a) a first step of a self-aligned BEOL process to expose vias to form a target according to a second embodiment of the invention and 10(b) a second step of a self-aligned BEOL process to etch the vias to form a target according to the second embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present example environments in which embodiments of the present invention may be implemented.

Figure 1:
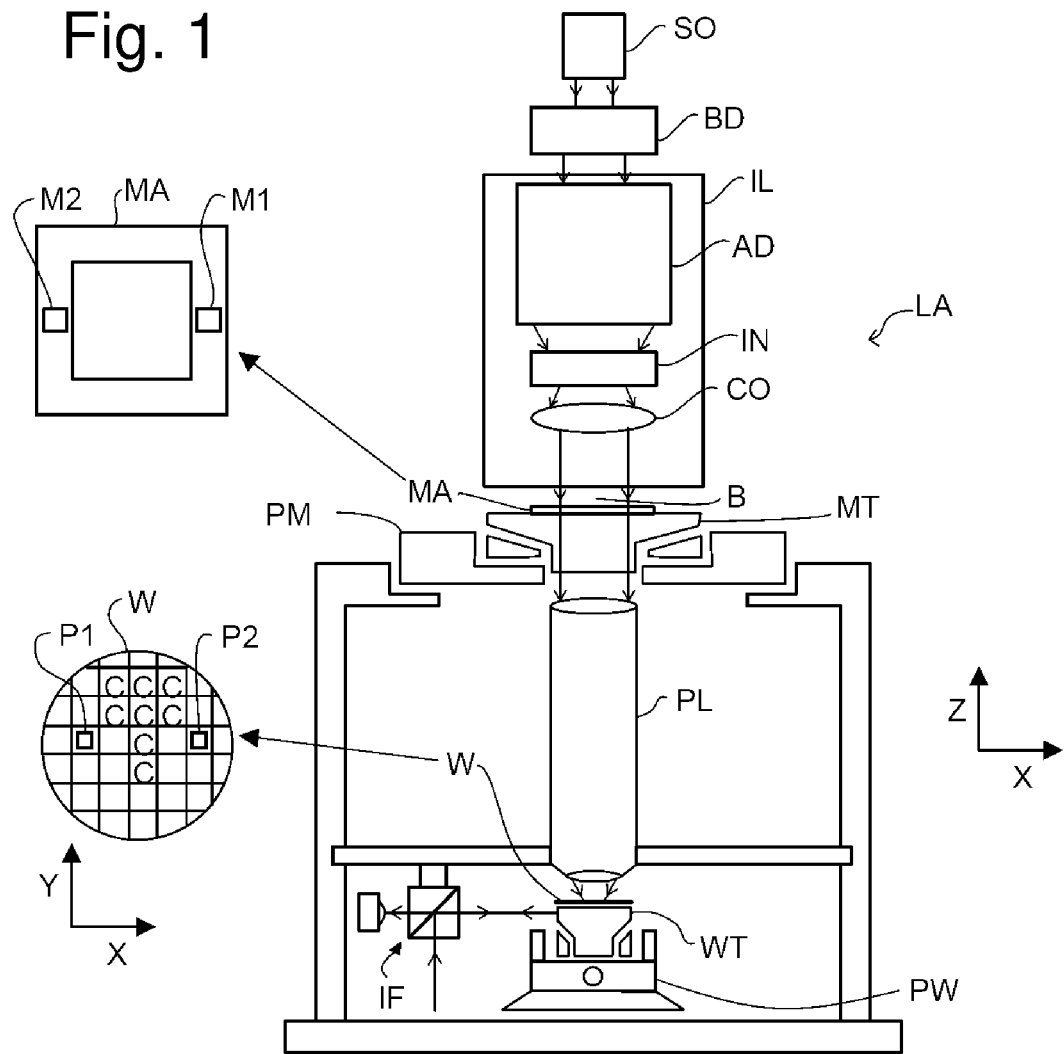
FIG. 1 depicts a lithographic apparatus.

FIG. 1 schematically depicts a lithographic apparatus. The apparatus comprises: an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist-coated wafer) W and connected to a second positioner PW configured to accurately position the substrate in accordance with certain parameters, and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable minor array of a type as referred to above.

Combinations and/or variations on the above described modes of use or entirely different modes of use may also be employed.

Figure 2:
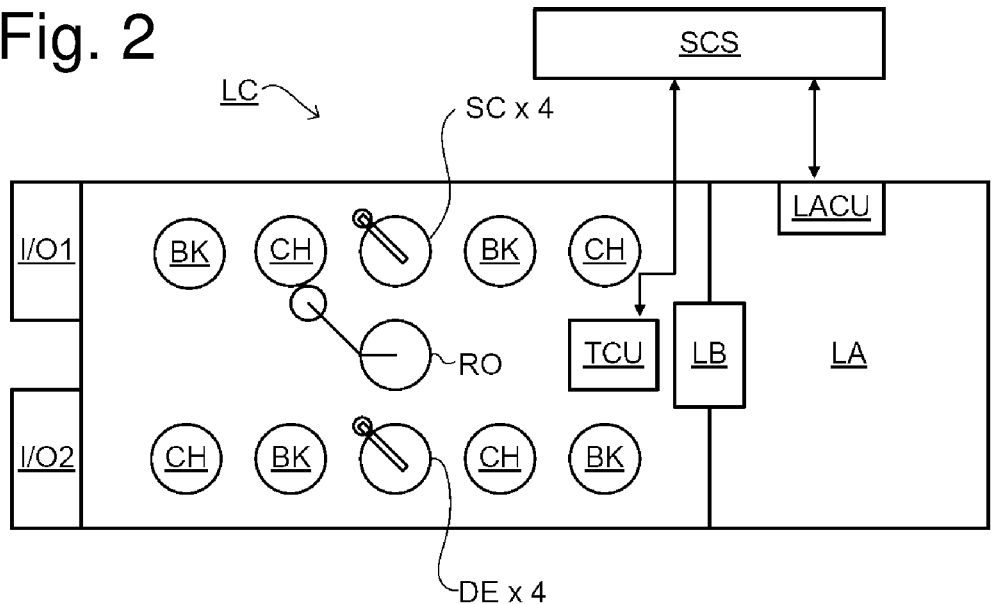
FIG. 2 depicts a lithographic cell or cluster.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
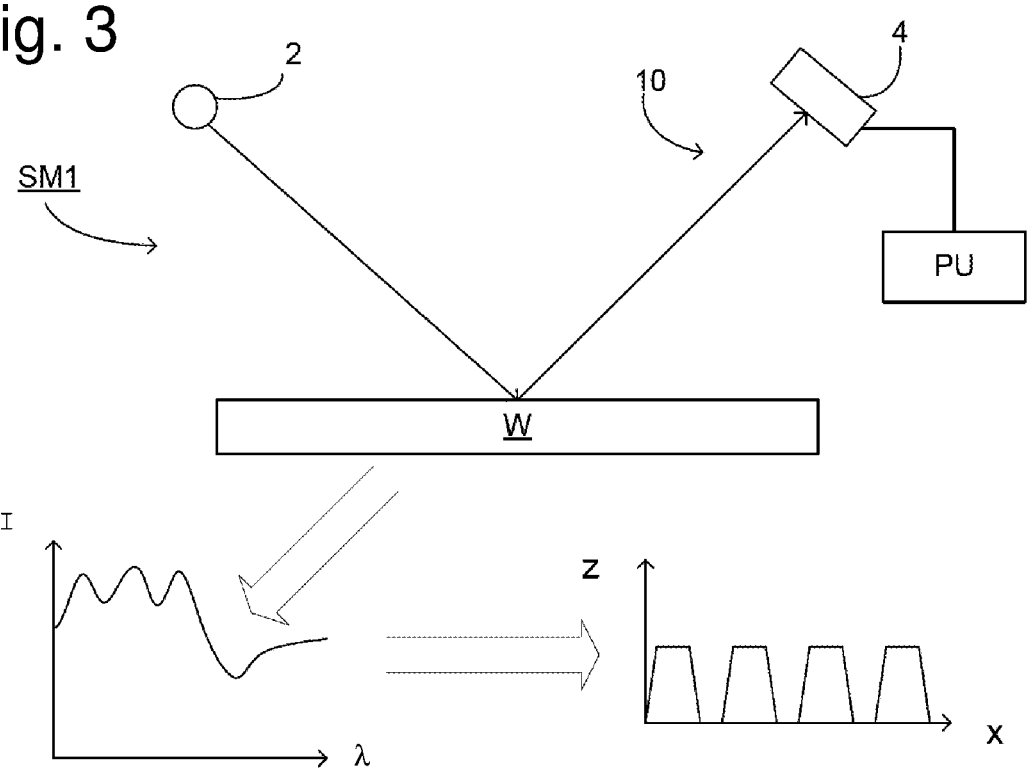
FIG. 3 depicts a first scatterometer.

FIG. 3 depicts a scatterometer which may be used in an embodiment of the present invention. It comprises a broad-band (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g., conventionally by Rigorous Coupled Wave Analysis (RCWA) and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
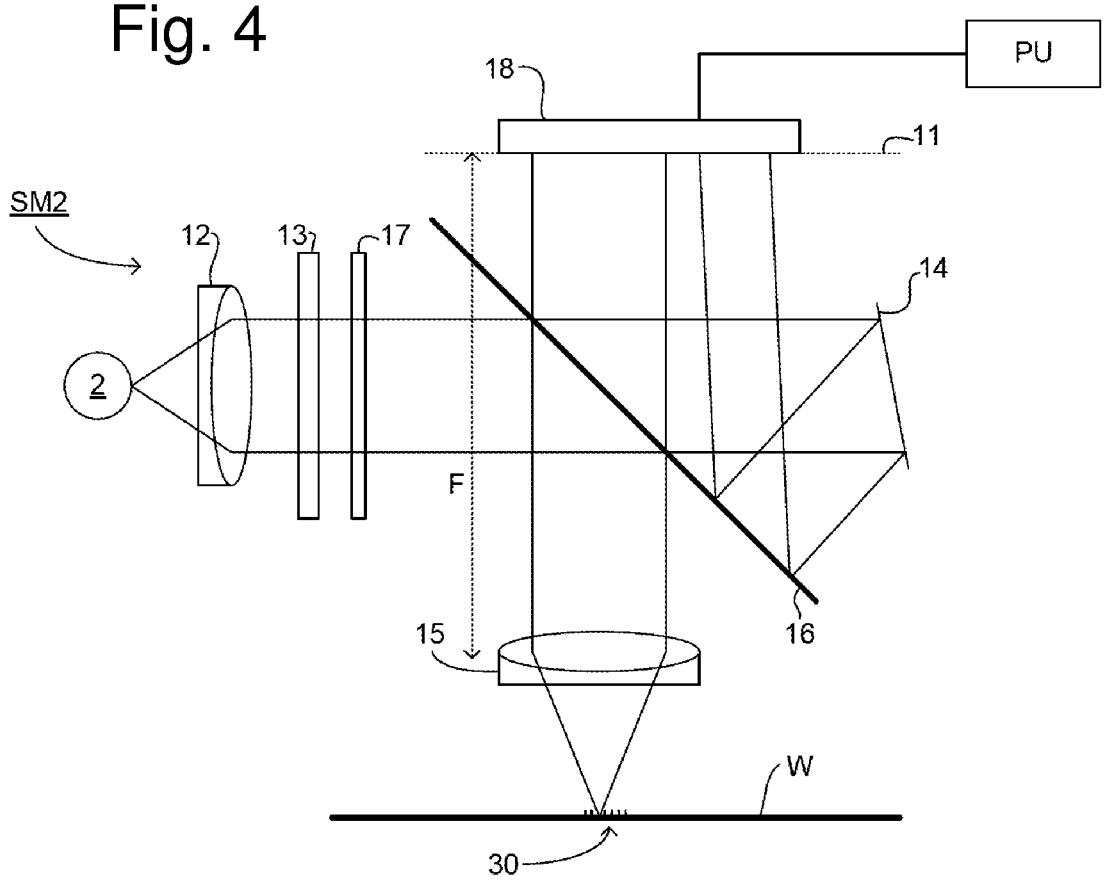
FIG. 4 depicts a second scatterometer.

Another scatterometer that may be used in an embodiment of the present invention is shown in FIG. 4. In this device, the radiation emitted by radiation source 2 is focused using lens system 12 through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18.

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e. one with a wide range of light frequencies or wavelengths—and therefore of colors) is possible, which gives a large etendue, allowing the mixing of multiple wavelengths. The plurality of wavelengths in the broadband preferably each has a bandwidth of $\Delta\lambda$ and a spacing of at least 2 $\Delta\lambda$ (i.e. twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A.

The target 30 on substrate W may be a grating, which is printed such that after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

Modelling

The purpose of rigorous optical diffraction theories in metrology is effectively the calculation of a diffraction spectrum that is reflected from the target. The target may be any target, whether purposely provided for measurement (e.g., a grating) or actual device structures which require measurement. Target shape information is obtained for CD (critical dimension) uniformity and overlay metrology. Overlay metrology is a measuring system in which the overlay of two targets is measured in order to determine whether two layers on a substrate are aligned or not. CD uniformity is simply a measurement of the uniformity of the grating on the spectrum to determine how the exposure system of the lithographic apparatus is functioning. Specifically, CD, or critical dimension, is the width of the object that is "written" on the substrate and is the limit at which a lithographic apparatus is physically able to write on a substrate. Another metric, edge placement error (EPE) is essentially a combination of overlay and CD.

Using one of the scatterometers described above in combination with modeling of a target structure such as the target 30 and its diffraction properties, measurement of the shape and other parameters of the structure can be performed in a number of ways. In a first type of process, represented by FIG. 5, a diffraction pattern based on a first estimate of the target shape (a first candidate structure) is calculated and compared with the observed diffraction pattern. Parameters of the model are then varied systematically and the diffraction re-calculated in a series of iterations, to generate new candidate structures and so arrive at a best fit. In a second type of process, represented by FIG. 6, diffraction spectra for many different candidate structures are calculated in advance to create a 'library' of diffraction spectra. Then the diffraction pattern observed from the measurement target is compared with the library of calculated spectra to find a best fit. Both methods can be used together: a coarse fit can be obtained from a library, followed by an iterative process to find a best fit.

Figure 5:
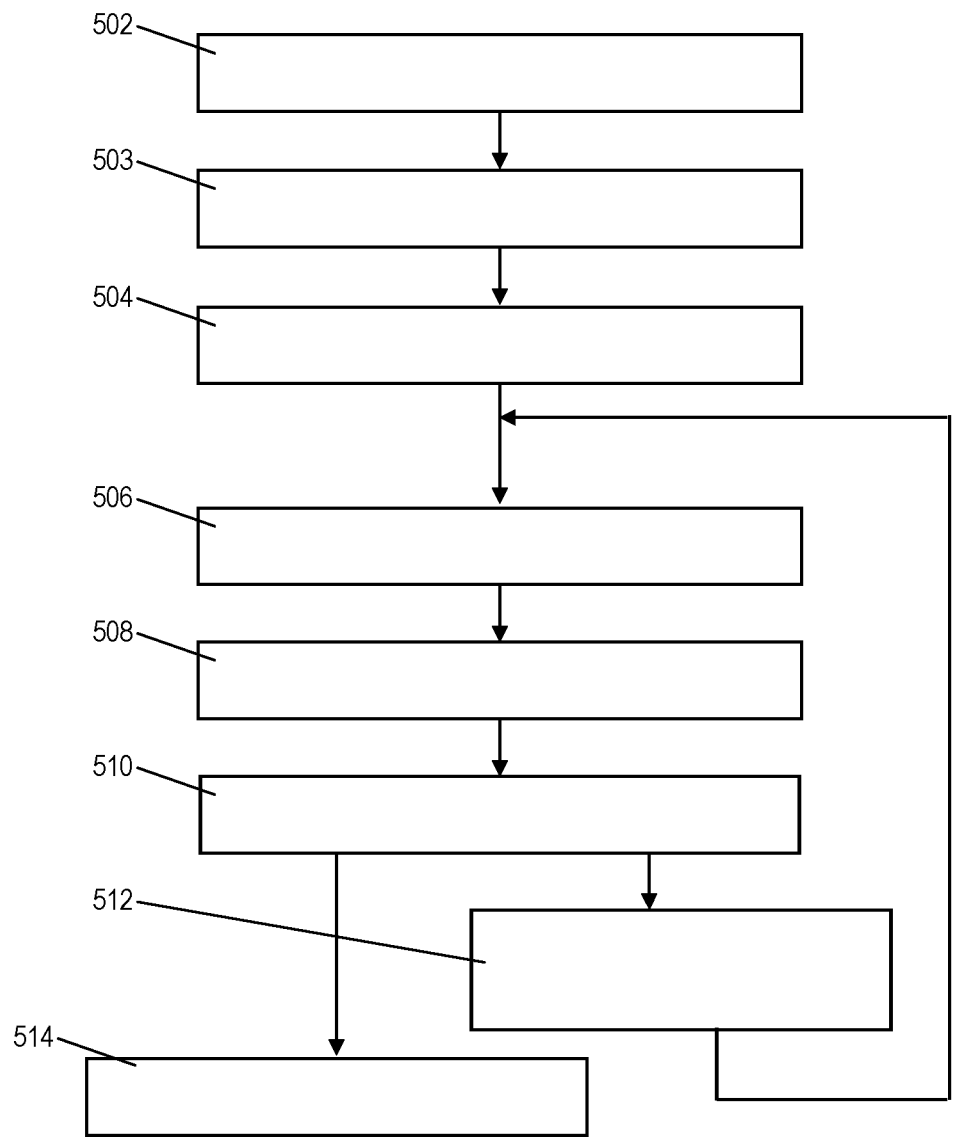
FIG. 5 depicts a first example process using an embodiment of the invention for reconstruction of a structure from scatterometer measurements.

Referring to FIG. 5 in more detail, the way the measurement of the target shape and/or material properties is carried out will be described in summary. The target will be assumed for this description to be a 1-dimensional (1-D) structure. In practice it may be 2-dimensional or 3-dimensional, and the processing will be adapted accordingly.

In step 502, the response, and more specifically the diffraction pattern, of the actual target on the substrate is measured using a scatterometer such as those described above. This measured diffraction pattern is forwarded to a calculation system such as a computer. The calculation system may be the processing unit PU referred to above, or it may be a separate apparatus.

In step 503, a 'model recipe' is established which defines a parameterized model of the target structure in terms of a number of parameters $p_i$ ($p_1$, $p_2$, $p_3$ and so on). These parameters may represent for example, in a 1D periodic structure, the angle of a side wall, the height or depth of a feature, the width of the feature. Properties of the target material and underlying layers are also represented by parameters such as refractive index (at a particular wavelength present in the scatterometry radiation beam). Specific examples will be given below. Importantly, while a target structure may be defined by dozens of parameters describing its shape and material properties, the model recipe will define many of these to have fixed values, while others are to be variable or 'floating' parameters for the purpose of the following process steps. For the purposes of describing FIG. 5, only the variable parameters are considered as parameters $p_i$.

In step 504: A model target shape is estimated by setting initial values $p_i^{(0)}$ for the floating parameters (i.e. $p_1^{(0)}$, $p_2^{(0)}$, $p_3^{(0)}$ and so on). Each floating parameter will be generated within certain predetermined ranges, as defined in the recipe.

In step 506, the parameters representing the estimated shape, together with the optical properties of the different elements of the model, are used to calculate the scattering properties, for example using a rigorous optical diffraction method such as RCWA or any other solver of Maxwell equations. This gives an estimated or model diffraction pattern of the estimated target shape.

In steps 508 and 510, the measured diffraction pattern and the model diffraction pattern are then compared and their similarities and differences are used to calculate a "merit function" for the model target shape.

In step 512, assuming that the merit function indicates that the model needs to be improved before it represents accurately the actual target shape, new parameters $p_1^{(1)}$, $p_2^{(1)}$, $p_3^{(1)}$, etc. are estimated and fed back iteratively into step 506. Steps 506-512 are repeated.

In order to assist the search, the calculations in step 506 may further generate partial derivatives of the merit function, indicating the sensitivity with which increasing or decreasing a parameter will increase or decrease the merit function, in this particular region in the parameter space. The calculation of merit functions and the use of derivatives is generally known in the art, and will not be described here in detail.

In step 514, when the merit function indicates that this iterative process has converged on a solution with a desired accuracy, the currently estimated parameters are reported as the measurement of the actual target structure.

The computation time of this iterative process is largely determined by the forward diffraction model used, i.e. the calculation of the estimated model diffraction pattern using a rigorous optical diffraction theory from the estimated target structure. If more parameters are required, then there are more degrees of freedom (note that "parameters" in this context (degrees of freedom) are internal to the Maxwell solver and are different from, and typically many more than, the model parameters described in the above steps). The calculation time increases in principle with the power of the number of degrees of freedom.

The estimated or model diffraction pattern (or more generally, response) calculated at 506 can be expressed in various forms. Comparisons are simplified if the calculated pattern is expressed in the same form as the measured pattern generated in step 510. For example, a modeled spectrum can be compared easily with a spectrum measured by the apparatus of FIG. 3; a modeled pupil pattern can be compared easily with a pupil pattern measured by the apparatus of FIG. 4.

Throughout this description from FIG. 5 onward, the term 'diffraction pattern' will be used, on the assumption that the scatterometer of FIG. 4 is used. The skilled person can readily adapt the teaching to different types of scatterometer, or even other types of measurement instrument.

Figure 6:
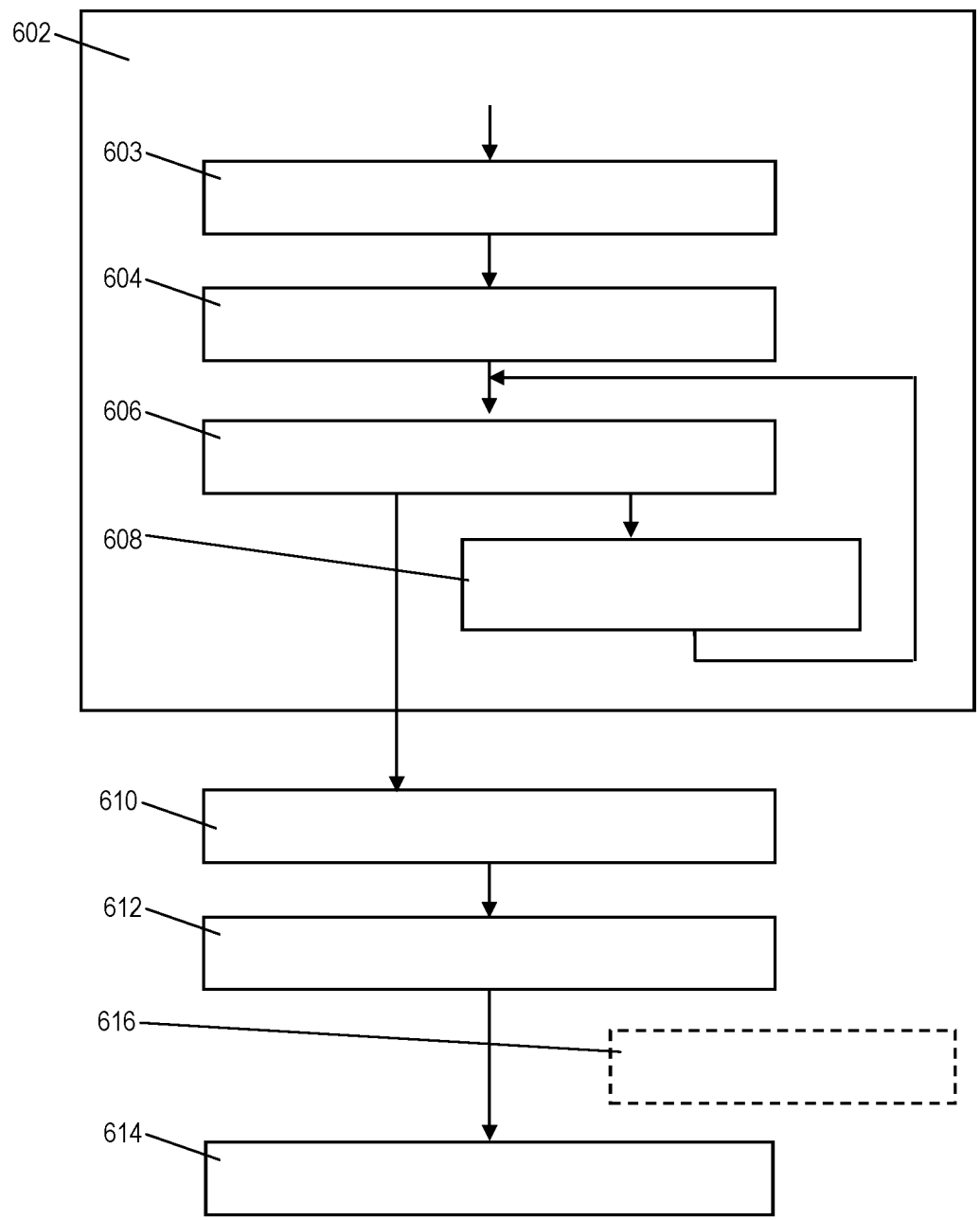
FIG. 6 depicts a second example process using an embodiment of the invention for reconstruction of a structure from scatterometer measurements.

FIG. 6 illustrates an alternative example process in which plurality of model diffraction patterns for different estimated target shapes (candidate structures) are calculated in advance and stored in a library for comparison with a real measurement. The underlying principles and terminology are the same as for the process of FIG. 5. The steps of the FIG. 6 process are:

In step 602, the process of generating the library is performed. A separate library may be generated for each type of target structure. The library may be generated by a user of the measurement apparatus according to need, or may be pre-generated by a supplier of the apparatus.

In step 603, a 'model recipe' is established which defines a parameterized model of the target structure in terms of a number of parameters $p_i$ ($p_1$, $p_2$, $p_3$ and so on). Considerations are similar to those in step 503 of the iterative process.

In step 604, a first set of parameters $p_1^{(0)}$, $p_2^{(0)}$, $p_3^{(0)}$, etc. is generated, for example by generating random values of all the parameters, each within its expected range of values.

In step 606, a model diffraction pattern is calculated and stored in a library, representing the diffraction pattern expected from a target shape represented by the parameters.

In step 608, a new set of parameters $p_1^{(1)}$, $p_2^{(1)}$, $p_3^{(1)}$, etc. is generated. Steps 606-608 are repeated tens, hundreds or even thousands of times, until the library which comprises all the stored modeled diffraction patterns is judged sufficiently complete. Each stored pattern represents a sample point in the multi-dimensional parameter space. The samples in the library should populate the sample space with a sufficient density that any real diffraction pattern will be sufficiently closely represented.

In step 610, after the library is generated (though it could be before), the real target 30 is placed in the scatterometer and its diffraction pattern is measured.

In step 612, the measured pattern is compared with the modeled patterns stored in the library to find the best matching pattern. The comparison may be made with every sample in the library, or a more systematic searching strategy may be employed, to reduce computational burden.

In step 614, if a match is found then the estimated target shape used to generate the matching library pattern can be determined to be the approximate object structure. The shape parameters corresponding to the matching sample are output as the measured shape parameters. The matching process may be performed directly on the model diffraction signals, or it may be performed on substitute models which are optimized for fast evaluation.

In step 616, optionally, the nearest matching sample is used as a starting point, and a refinement process is used to obtain the final parameters for reporting. This refinement process may comprise an iterative process very similar to that shown in FIG. 5, for example.

A method will now be described for measurement of an overlay metric. An overlay metric, in this context, may comprise overlay itself (measurement of the relative positional error between layers) and/or a related/derived metric such as edge placement error (EPE). The EPE provides a variation in the location of an edge of a structure created by the patterning process. In an embodiment, the EPE is derived from an overlay value. In an embodiment, the EPE is derived from a combination of an overlay value and CD value. In an embodiment, the edge placement is derived from a combination of an overlay value, a CD value and a value corresponding to a local variation (e.g., edge roughness, shape asymmetry, etc. of the individual structures). In an embodiment, the EPE comprises an extreme value (e.g., 3 standard deviation, i.e., 3σ) of overlay and CD errors combined. In a specific embodiment, in a multi-patterning process involving creating structures and involving "cutting" structures by removing a portion of structure through etching of a pattern provided by the patterning process in relation to the structure, the EPE may have the following form (or comprises one or more of the following terms):

$$EPE = \sqrt{(3\sigma_{overlay})^2 + \left(\frac{3\sigma_{CDU_{structures}}}{2}\right)^2 + \left(\frac{3\sigma_{CDU_{cuts}}}{2}\right)^2 + \frac{3\sigma_{OPE,PBA}}{2} + 6\sigma_{LER,LPE}}$$

wherein σ is standard deviation, or $\sigma_{overlay}$ corresponds to the standard deviation of overlay, corresponds to the standard deviation of overlay, $\sigma_{CDU_{structures}}$ corresponds to the standard deviation of the critical dimension uniformity (CDU) of structures created in the patterning process, $\sigma_{CDU_{cuts}}$ corresponds to the standard deviation of the critical dimension uniformity (CDU) of cuts, if any, created in the patterning process, $\sigma_{OPE,PBA}$ corresponds to the standard deviation of optical proximity effects (OPE) and/or proximity bias average (PBA) which is a difference between CD at pitch to a reference CD, and $\sigma_{LER,LPE}$ corresponds to the standard deviation of line edge roughness (LER) and/or local placement error (LPE). While formulation above is in relation standard deviation, it can be formulated in a different comparable statistical manner, such as variance.

At present, overlay metrology, for determining overlay or a derived overlay metric such as EPE, is usually performed on the basis of measuring an asymmetry in a structure and inferring overlay from the measured asymmetry. As discussed above, a fast and non-invasive form of specialized metrology tool is one in which a beam of radiation is directed onto a target on the surface of the substrate and properties of the scattered (diffracted/reflected) beam are measured. By evaluating one or more properties of the radiation scattered by the substrate, one or more properties of the substrate can be determined. This may be termed diffraction-based metrology. One such application of this diffraction-based metrology is in the measurement of feature asymmetry within a target. For example, asymmetry can be measured by comparing opposite parts of the diffraction spectrum (for example, comparing the −1st and +1st orders in the diffraction spectrum of a periodic grating). This can be done as described above and as described, for example, in U.S. patent application publication US2006-066855, which is incorporated herein in its entirety by reference. Other methods comprise measuring intensities in darkfield images, e.g., by comparing the intensities of the −1st and +1st orders in such images. Another overlay metrology technique is based on measurement of structure asymmetry in product resolution structures (rather than grating pairs), hereafter referred to as ARO metrology (at-resolution overlay metrology). ARO metrology is described in PCT patent application publication WO2017/149009 which is incorporated herein by reference. ARO metrology is a reconstruction based overlay metrology which does not require biased targets. The method described in this document is based in measurement of the "asymmetric pupil" or asymmetric spectrum/intensity distribution. The asymmetric pupil is the pupil (the measured intensity distribution in the pupil or Fourier plane) from which the symmetric intensity distribution component has been removed; i.e., a particular pupil image pixel can have the symmetric intensity distribution component removed by subtracting from the intensity at that particular pupil image pixel, the intensity of a symmetrically located pupil image pixel, and vice versa.

Now, while these techniques are effective, it is desirable to provide a new measurement technique, and in particular a technique which can derive an overlay metric from changes in a symmetrical structure, e.g., without being based on measuring changes in structural asymmetry. In an embodiment, such a method may comprise using the full pupil, without removal of the symmetrical component of the pupil. By not discarding the symmetric component, a much stronger overlay metric signal is obtained.

In one embodiment, where it is known that the structure being measured should be symmetrical, the residual asymmetric pupil (asymmetric pupil component) can be used to model the (unknown) source for the asymmetry in the signal. This new model can be used to infer the full wafer/targets so as to find potential non-yielding targets (i.e., targets indicative of non-yielding dies). In an alternative embodiment, it may be that only the symmetrical component of the pupil is used, thereby removing unwanted asymmetries (e.g., by removing the asymmetric component derived as described above, or by an equivalent method). This should result in an easier converging model with lower residuals.

Such a method may comprise measuring the pupil (angularly resolved intensity and/or phase distribution) in the pupil (Fourier) plane, resultant from radiation reflected and/or diffracted from a target structure (e.g., comprising zeroth order and/or higher diffraction orders), and performing a reconstruction of the geometry of the target structure using reconstruction techniques such as those described above (e.g., as used in CD metrology). In an embodiment, such a method will provide for a combined determination of CD and overlay (and therefore a measure of EPE). This will increase metrology speed and throughput compared to present methods, where typically overlay and CD are measured separately using different techniques.

To facilitate such an approach, a target structure which has an overlay dependent profile should be formed on a substrate, from which the overlay metric can be inferred. The overlay dependent profile does not need to rely on any asymmetry and therefore may be symmetrical with respect to the direction of overlay being measured.

A specific method for defining an overlay dependent profile will now be described. This method is based on "self-aligned" lithography techniques. Such self-aligned techniques are typically presently used in back-end-of-line (BEOL) processing, but are not so limited and are can be applied to front-end-of-line (FEOL) and/or middle-of-line (MOL) processing, e.g., to form the gate contact on a transistor, or other integrated circuit manufacturing processes.

In a self-aligned process flow, etch selectivity is used to help align positioning of a target structure or feature, e.g., by defining a feature contour, such that relatively minor deviations in an exposed feature (before etch) do not result in a significant change in position of the resultant etched feature. As such, the etch step results in the feature being self-aligned with respect to a hard-mask or other feature (such as a resultant metal feature) in a layer.

Figure 7:
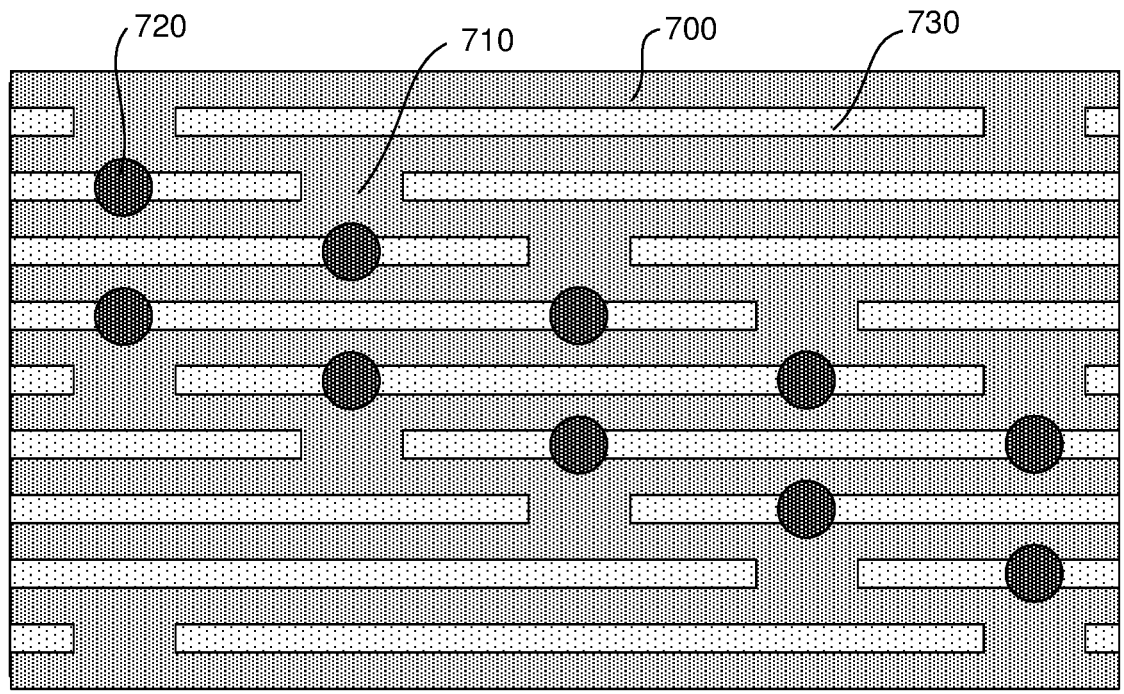
Figure 7:
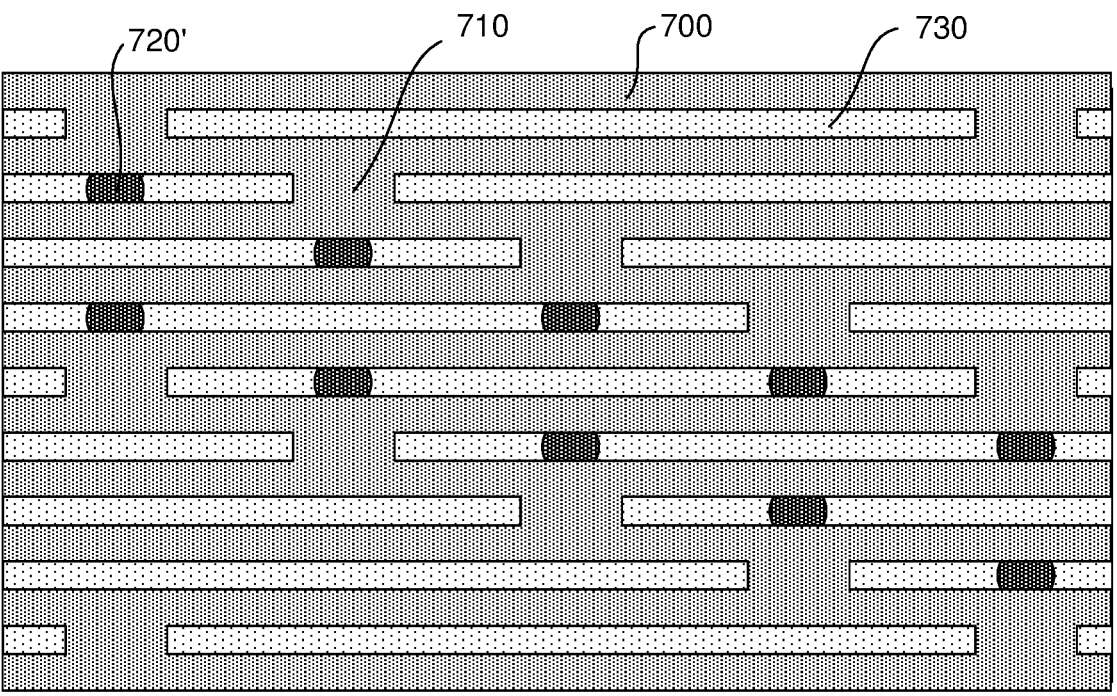

FIG. 7 illustrates a specific example showing schematically, two steps of a BEOL self-aligned procedure. The diagram shows (a) hard-mask lines 700 and hard-mask blocks 710 for forming a metal layer, on a dielectric layer 730, onto which vias 720 have been exposed; and (b) the same arrangement after an etch step, to etch the vias 720' into the dielectric 730. In general, overlay and CD are involved in forming the final via shape, which is important for interconnects resistance and eventually device yield. The etching step etches the exposed vias 720 into only the dielectric 730, and not the hard-mask 700, 710, to obtain the etched vias 720'. To take advantage of this, the exposed vias 720 are exposed oversized; i.e., bigger than necessary with respect to the width of the dielectric 730 they are being etched into. It will be appreciated that, because of this, there is some margin or scope for variation of the position (i.e., overlay) in the Y direction of exposed vias 720 with respect to hard-mask lines 700, and in the shape/contour or CD of the exposed via, without significantly affecting the shape and functionality of the etched vias 720'. As such, EPE of the etched via 720' is largely resilient to variation in CD or overlay in the exposed via 720.

FIGS. 8 and 9 illustrate a novel target concept, based on the self-aligned techniques described above, which provides an at-resolution overlay target that can be measured and overlay extracted using the symmetrical component of the pupil. The arrangement of FIG. 8 is largely synonymous with that of FIG. 7, and shows (a) hard-mask lines 800 and blocks 810 on dielectric 830, with vias 820 exposed thereon and (b) the same arrangement after an etch step, to etch the exposed vias 820 into the dielectric 830 to obtain etched vias 820'. The difference between this target arrangement and the product arrangement of FIG. 7, is that for the target arrangement, there is a deliberate overlay offset in the Y direction between the position of exposed vias 820 and hard mask lines 800, such that the etched via 820' has a contour similar to that shown in FIG. 8(*b*). The offset may be such that (assuming overlay error is zero), the exposed via(s) 820 contact only one hard mask line 800 and therefore each etched via 820' comprises a semi-circular shape (of course, this would be highly undesirable for actual product structures and therefore the offset should be implemented only in dedicated target areas for metrology purposes). As such, the offset may be such that (without overlay) the etch step removes approximately half of the exposed via (e.g., over 40%, over 45%). However, this is only an example and other feature shapes and positional offsets are possible.

Such a target may be exposed in one or more target areas (e.g., at locations amongst product structures such as illustrated in FIG. 7), and each target area may comprise only one, or more than one etched via 820'. Where a target comprises more than one etched via 820', the measured overlay metric may comprise an average (or other combination) of values corresponding to each etched via 820'. It can be appreciated that the target 820' will have the same or similar feature size, and the same pitch than the product structures 720' it will be used to measure. Due to this small feature size, it may be that present scatterometers cannot measure a single feature (etched via) in isolation (although future scatterometers or scanning electron microscope (SEM) devices might be able to). Where single feature measurement is not possible, a measurement may comprise reconstructing a plurality of etched vias 820'. In this case, an average or other representative values may be used for the determination of one or more of overlay, CD or EPE. Outliers may optionally be removed before averaging.

FIG. 9 shows the exposed vias 820 and corresponding etched vias 820' for (a) a first Y direction overlay value, (b) a second Y direction overlay value and (c) a third Y direction overlay value. In each case, the relative position in the Y direction between exposed via 820 and the metal layer, and therefore hard-mask line 800 is intended to be the same (i.e., the vias are exposed with the same deliberate offset) such that the differences between the arrangements depicted in FIGS. 9(*a*)-(*c*) result only form overlay error, and/or an overlay metric variation (e.g., variation in EPE). In each case, it can be seen that the etched via 820' has a significantly different contour. It can also be seen that, for this embodiment, the contour is essentially symmetrical around the Y axis, such that the contour differences in FIGS. 9(*a*), (*b*) and (*c*) do not result in a significant change in asymmetry.

A scatterometry measurement will be sensitive to this change in contour. In particular, the (angularly resolved) intensity and/or phase distribution spectrum (pupil) of an angularly resolved (pupil plane) measurement, including (or only) its symmetrical component, will be sensitive to this change. This is because a change in overlay results in an actual change in the contour and/or CD of the measured feature (vias 820'), rather than causing only a shift in the feature. Therefore it is proposed to reconstruct the contour from the distribution spectrum, and derive the overlay metric from the reconstructed contour. In an embodiment, the reconstruction will reconstruct both CD and the contour (e.g., simultaneously), to derive overlay and CD. In an embodiment, this derived overlay and CD is used to derive EPE (or EPE is derived directly from the reconstructed contour). Reconstruction of the contour may use any of the methods described above with reference to FIGS. 5 and 6. Overlay can also be inferred from the distribution spectrum using the methods described in the aforementioned WO2017148982, but without the step of removing the symmetrical component from the distribution spectrum. Such a method determines and assigns weights to each pixel in the measurement distribution depending on the pixel's sensitivity to overlay, with the pixels summed according to the weightings to determine overlay.

FIG. 10 shows a second BEOL embodiment, which is able to measure overlay in the X direction, in addition to (or instead of) overlay in the Y direction. As before, this embodiment also enables simultaneous measurement of CD, and therefore EPE. The arrangement of FIG. 10 is largely synonymous with that of FIG. 8, and shows (a) hard-mask lines 1000 and hard-mask blocks 1010 on dielectric 1030, with vias 1020 exposed thereon; and (b) the same arrangement after an etch step, to etch the exposed vias 1020 into the dielectric 1030 to obtained etched vias 1020'. The difference between this target arrangement and the product arrangement of FIG. 8, is that the vias 1020 are each exposed adjacent to, and partially overlapping, a hard-mask block 1010 for a metal layer. It can be appreciated that the result is that the etched vias 1020' will have a contour that is dependent on overlay in X (and Y). However, a target formed according to this embodiment may have a pitch which differs from that of the product structures (in contrast to the FIG. 8 embodiment which will have the same pitch as the product structures).

In a further embodiment, instead of measuring dedicated targets, the measurements may be performed on actual product structure, e.g., the target structure may comprise actual product structure such as illustrated in FIG. 7(*b*). In such an embodiment, it may not be possible to measure small overlay/CD variation. However, if a via was formed with overlay/CD deviations which are large enough to result in a non-functioning device, then the self-aligned process will likely result in a measurable change in contour using the methods described herein.

An advantage of the method described above, in the specific context of via formation in a BEOL process, is that it provides an in-line metric for measuring the via. Presently, electrical techniques are used to measure the resistance of the interconnect (formed in the via) after a metallization step, including forming of additional metal layers. As the vias are one of the more important parameters in determining the interconnect resistance, the ability to monitor the vias using an in-line scatterometry method, before metallization will be very beneficial. Additionally, these methods provide a non-destructive, after-etch measurement of via shape. This measurement can be used to infer or reconstruct the via CD and overlay simultaneously (and therefore EPE). This information can be used to determine a correction of overlay and/or CD contributions resultant from the scanner and/or etcher, which can be fed back to the appropriate apparatus.

Embodiments of the present invention may be implemented by implementing the methods described herein on the processing units PU described with reference to FIGS. 3 and 4 to provide an inspection apparatus for reconstructing an approximate structure of an object. Also, while the metrology is described using a scatterometer, the disclosed target structure may be measured using any other type of suitable metrology device (e.g., an SEM).

The processors described with reference to FIG. 3 or 4 may operate under the control of computer programs containing one or more sequences of machine-readable instructions for calculating electromagnetic scattering properties of a structure, the instructions being adapted to cause one or more processors to perform the methods described herein.

Although specific reference may be made in this text to the use of inspection apparatus in the manufacture of ICs, it should be understood that the inspection apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The methods according to embodiments of the present invention described above may be incorporated into the forward diffraction model for reconstructing an approximate structure of an object from a detected electromagnetic scattering property, such as a diffraction pattern, arising from illumination of the object by radiation, as described above with reference to FIGS. 5 and 6. The processing unit PU described above with reference to FIGS. 3 and 4 may be configured to reconstruct an approximate structure of an object using this method.

Further embodiments according to the invention are described in below numbered clauses:

1. A method for determining an overlay metric from a target structure, said method comprising:
    obtaining angle resolved distribution spectrum data relating to a measurement of the target structure, said angle resolved distribution spectrum data comprising a symmetrical component;
    determining an overlay dependent contour of a feature of said target structure from said angle resolved distribution spectrum data; and
    determining said overlay metric from said contour.
2. A method according to clause 1, wherein the step of determining an overlay dependent contour of a feature of said target structure from said angle resolved distribution spectrum data comprises determining the contour from said angle resolved distribution spectrum data without first removing said symmetrical component.
3. A method according to clause 2, wherein said step of determining an overlay dependent contour comprises performing a reconstruction of the target structure using a parameterized geometric model of the target structure.
4. A method according to any preceding clause, further comprising determining critical dimension of the feature from said contour, simultaneously with said overlay metric.
5. A method according to any preceding clause, wherein the overlay metric comprises overlay or edge placement error.
6. A method according to any preceding clause, wherein the angle resolved distribution spectrum data relates to a measurement of the target structure performed subsequent to an etch step.
7. A method according to clause 6, wherein said feature comprises a feature formed by a self-aligned process, such that etch selectivity during the etch step defines said contour in dependence of overlay.
8. A method according to clause 6 or 7, wherein said feature is an etched via, having been exposed with a deliberate offset with respect to a masked layer.
9. A method according to clause 8, wherein said deliberate offset is such that, without overlay, approximately half of said exposed via is removed during said etch step, the actual amount removed being dependent on overlay.
10. A method according to any preceding clause, comprising performing a scatterometry metrology step to obtain said obtaining an angle resolved distribution spectrum data.
11. A method according to any preceding clause, wherein said target structure comprises a plurality of said features, and said overlay metric is an average of the individual values for the overlay metric determined for each of the individual features.
12. A method according to any preceding clause, comprising removing an asymmetrical component from the angle resolved distribution spectrum data, thereby determining the overlay dependent contour from only said symmetrical component.
13. A method according to any of clauses 1 to 11, comprising determining a cause for an asymmetrical component in the angle resolved distribution spectrum data.
14. A method according to clause 13, comprising making a yield prediction in the determined cause for the asymmetrical component.
15. A method according to any preceding clause, comprising performing an exposure and etch step to form said target structure.
16. A method of forming a target structure on a substrate, comprising:
    exposing an exposed feature onto a masked layer comprising a mask which defines masked and unmasked areas of the layer, such that a first portion of the exposed feature is exposed on a masked area of said layer and a second portion of the exposed feature is exposed on a non-masked area of said layer, the size of the first portion with respect to the second portion being overlay dependent; and
    performing an etch step to define an etched feature, said etched feature corresponding to said second portion of the exposed feature.
17. A method according to clause 16, wherein said feature is formed by a self-aligned process, such that etch selectivity during the etch step defines a contour of the etched feature in dependence of overlay.
18. A method according to clause 17, wherein the masked and unmasked areas are such that first portion and second portion are divided in a single direction such that a contour of said etched feature is dependent on overlay in only a first direction.
19. A method according to clause 18, wherein the feature is substantially symmetrical around an axis in said first direction.
20. A method according to clause 19, wherein the etched feature has a substantially semi-circular shape.
21. A method according to clause 18, 19 or 20, wherein the target structure comprises a plurality of said features having a pitch the same as that of surrounding product structures.
22. A method according to clause 17, wherein the masked and unmasked areas are such that first portion and second portion are divided in two directions such that a contour of said etched feature is dependent on overlay in two directions.
23. A method according to clause 22, wherein the etched feature has a substantially quarter-circular shape
24. A method according to any of clauses 16 to 23, wherein the exposed feature corresponds to exposed features for forming vias, but exposed with a deliberate offset with respect to the masked layer.
25. A substrate comprising a target structure formed by the method according to any of clauses 16 to 24.
26. A set of reticles comprising complementary patterns for exposing a target structure according to the method according to any of clauses 16 to 24.
27. An inspection apparatus comprising:
    projection optics for projecting measurement radiation onto a structure on a substrate;
    a detection arrangement operable to obtain a measured response resultant from scattering of said measurement radiation by said structure; and a processor; wherein
said inspection apparatus being operable to perform the method of any of clauses 1 to 14.
28. A manufacturing apparatus comprising:
a lithographic exposure apparatus comprising:
an illumination source for providing exposure illumination;
a reticle stage for holding a patterning device which patterns said exposure illumination; and
a substrate stage for holding the substrate;
said lithographic exposure apparatus being operable to perform the exposure step of any of clauses 16 to 24.
29. The manufacturing apparatus of clause 28, comprising an etch apparatus for performing the etch step of any of clauses 16 to 24
30. A lithographic cell comprising the manufacturing apparatus of clause 28 or 29, and the inspection apparatus of clause 27, said lithographic cell being further operable to:
use the overlay metric to determine a correction for a manufacturing process being performed by the manufacturing apparatus; and
use the correction in subsequent performance of said manufacturing process.
31. A lithographic cell according to clause 30, wherein the inspection apparatus is operable to determine the overlay metric prior to performing a metallization step in said manufacturing process.
32. A computer program product containing one or more sequences of machine-readable instructions, the instructions being adapted to cause one or more processors to perform a method according to any of clauses 1 to 14.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The term "electromagnetic" encompasses electric and magnetic.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method for determining an overlay metric from a target structure, the method comprising:
obtaining angle resolved distribution spectrum data relating to a measurement of the target structure, the angle resolved distribution spectrum data comprising a symmetrical component;
determining an overlay dependent contour of a feature of the target structure from the angle resolved distribution spectrum data; and
determining the overlay metric from the contour.

2. The method of claim 1, wherein the determining an overlay dependent contour of a feature of the target structure from the angle resolved distribution spectrum data comprises determining the contour from the angle resolved distribution spectrum data without first removing the symmetrical component.

3. The method of claim 2, wherein the determining an overlay dependent contour comprises performing a reconstruction of the target structure using a parameterized geometric model of the target structure.

4. The method of claim 1, further comprising determining a critical dimension of the feature from the contour substantially simultaneously with the overlay metric.

5. The method of claim 1, wherein the overlay metric comprises overlay or edge placement error.

6. The method of claim 1, wherein the angle resolved distribution spectrum data relates to a measurement of the target structure performed subsequent to an etch step.

7. The method of claim 6, wherein the feature comprises a feature formed by a self-aligned process, such that etch selectivity during the etch step defines the contour in dependence of overlay.

8. The method of claim 6, wherein the feature is an etched via, having been exposed with a deliberate offset with respect to a masked layer.

9. The method of claim 8, wherein the deliberate offset is such that, without overlay, approximately half of the exposed via is removed during the etch step, the actual amount removed being dependent on overlay.

10. The method of claim 1, further comprising performing a scatterometry metrology step to obtain the angle resolved distribution spectrum data.

11. The method of claim 1, wherein:
the target structure comprises a plurality of the features, and
the overlay metric is an average of the individual values for the overlay metric determined for each of the individual features.

12. The method of claim 1, comprising removing an asymmetrical overlay dependent contour from only the symmetrical component.

13. The method of claim 1, further comprising determining a cause for an asymmetrical component in the angle resolved distribution spectrum data.

14. The method of claim 13, further comprising making a yield prediction in the determined cause for the asymmetrical component.

15. The method of claim 1, further comprising performing an exposure and etch step to form the target structure.

16. An inspection apparatus comprising:
projection optics configured to project measurement radiation onto a structure on a substrate;
a detection arrangement operable to obtain a measured response resultant from scattering of the measurement radiation by the structure; and
a processor configured to determine an overlay metric from a target structure by:
obtaining angle resolved distribution spectrum data relating to a measurement of the target structure, the angle resolved distribution spectrum data comprising a symmetrical component;
determining an overlay dependent contour of a feature of the target structure from the angle resolved distribution spectrum data; and
determining the overlay metric from the contour.

17. A non-transitory computer program product containing one or more sequences of machine-readable instructions, the instructions being adapted to cause one or more processors to perform operations comprising:
determining an overlay metric from a target structure by:
obtaining angle resolved distribution spectrum data relating to a measurement of the target structure, the angle resolved distribution spectrum data comprising a symmetrical component;
determining an overlay dependent contour of a feature of the target structure from the angle resolved distribution spectrum data; and
determining the overlay metric from the contour.

* * * * *